[12] United States Patent  
Choi et al.

(10) Patent No.: US 9,371,979 B2
(45) Date of Patent: Jun. 21, 2016

(54) METHOD AND HARDWARE TO ENHANCE LIGHT OUT-COUPLING

(71) Applicant: Nano and Advanced Materials Institute Limited, Hong Kong (HK)

(72) Inventors: Tsang Ming Michael Choi, Hong Kong (HK); Yuen Yan Gena Tsang, Hong Kong (HK); Kwok Keung Paul Ho, Hong Kong (HK)

(73) Assignee: NANO AND ADVANCED MATERIALS INSTITUTE LIMITED, Hong Kong (HK)

( * ) Notice: Subject to any disclaimer, the term of this patent is extended or adjusted under 35 U.S.C. 154(b) by 189 days.

(21) Appl. No.: 14/271,459

(22) Filed: May 7, 2014

(65) Prior Publication Data

US 2015/0003056 A1  Jan. 1, 2015

Related U.S. Application Data

(60) Provisional application No. 61/957,167, filed on Jun. 26, 2013.

(51) Int. Cl.
| | |
|---|---|
| *F21V 13/10* | (2006.01) |
| *G02B 19/00* | (2006.01) |
| *H01L 33/60* | (2010.01) |
| *F21V 13/12* | (2006.01) |
| *H01L 51/52* | (2006.01) |
| *H01L 25/075* | (2006.01) |
| *H01L 27/15* | (2006.01) |
| *H01L 33/50* | (2010.01) |
| *H01L 27/32* | (2006.01) |

(52) U.S. Cl.
CPC ................. *F21V 13/10* (2013.01); *F21V 13/12* (2013.01); *G02B 19/0066* (2013.01); *H01L 33/60* (2013.01); *H01L 51/5271* (2013.01); *H01L 25/0753* (2013.01); *H01L 27/156* (2013.01); *H01L 27/322* (2013.01); *H01L 33/505* (2013.01); *H01L 2924/0002* (2013.01)

(58) Field of Classification Search
CPC ......... F21V 11/00; F21V 11/02; F21V 11/06; F21V 13/10; F21V 13/12; G02B 19/0066; H01L 25/0753; H01L 27/156; H01L 27/322; H01L 33/60; H01L 33/505; H01L 51/5271; H01L 2924/0002
See application file for complete search history.

(56) References Cited

U.S. PATENT DOCUMENTS

| | | |
|---|---|---|
| 6,476,551 B1 | 11/2002 | Osawa et al. |
| 2006/0043382 A1 | 3/2006 | Matsui et al. |
| 2007/0228386 A1 | 10/2007 | Shie et al. |
| 2009/0109678 A1 | 4/2009 | Hsu et al. |
| 2010/0108998 A1* | 5/2010 | Verjans .................. F21V 11/02 257/40 |
| 2012/0223875 A1 | 9/2012 | Lau et al. |

OTHER PUBLICATIONS

European Search Report dated on Nov. 13, 2014 by European Patent Office.

* cited by examiner

*Primary Examiner* — Stephen F Husar
(74) *Attorney, Agent, or Firm* — Ella Cheong Hong Kong; Sam T. Yip

(57) ABSTRACT

The present invention provides an enhanced light out-coupling device for extraction of light radiation from a light source. The enhanced light out-coupling device comprises a grid having a plurality of channels, a reflective material layer coated on the grid, and a high refractive index fluid layer. In addition, the grid can be filled with phosphor particles for light converting. The device of the presently claimed invention is able to effectively avoid the scattering problem generated from the sapphire substrate and phosphor particles, as well as reduce light adsorption by the array of grid during the light extraction, leading to better image quality.

22 Claims, 6 Drawing Sheets

METHOD AND HARDWARE TO ENHANCE LIGHT OUT-COUPLING

CROSS-REFERENCE TO RELATED APPLICATION

This application claims benefits from the U.S. provisional patent application No. 61/957,167 filed Jun. 26, 2013, and the disclosure of which is incorporated herein by reference in its entirety.

FIELD OF THE INVENTION

The present invention generally relates to a light out-coupling device. More preferably, it relates to an enhanced light out-coupling device for extraction of light radiation from a light source. The present invention also relates to a method for fabricating said light out-coupling device.

BACKGROUND OF THE INVENTION

Light scattering has been a problem during the development of light emitting diode on silicon (LEDoS) device. It is due to the fact that the high refractive index of sapphire substrate of the LED chip enhance scattering. In addition, the use of phosphor particles for light conversion from blue to green and from blue to red colors will further enhance the scattering. This problem leads to unclear images when the LED pointed-light source is used to project light onto a screen, and adversely affects the LEDoS to be used for projector application.

Insertion of collimator or grid may help to reduce scattering, as demonstrated in U.S Patent Application Publication No. 2012/0223875, but the light intensity is also reduced since the grid/collimator absorbs a certain amount of light. Similarly, it is still not favorable when the light source is used for projector application. '875 is also not suitable for LED array in relatively smaller size as their claimed device lowers the light intensity of the light travelling through the grid-like structure due to the size limitation.

The problem becomes worse when the size of micro-display is getting smaller. For a collimator with channel size less than 100 µm, the light absorbed by the sidewall becomes significant and the intensity of emitted light is reduced dramatically.

SUMMARY OF THE INVENTION

A first aspect of the present invention provides an enhanced light out-coupling device, such as a collimator, comprising a grid having channels and highly reflective surface. The highly reflective surface, being a mirror-like coating, is able to enhance light extraction from a light source. The enhanced light out-coupling device can be filled with the light converting phosphors, which convert the light from the light source to longer wavelength. The reflective surface of the enhanced light out-coupling device can further help to extract the light with longer wavelength from the light converting phosphors. The light out-coupling device can further comprise a high refractive index fluid layer filled in the space between the grid and the light source such that light scattering problem generated from a sapphire substrate is further minimized.

A second aspect of the present invention provides a method for fabricating said light out-coupling device, comprising the steps of forming a grid, and coating a reflective material layer on the grid. The step of forming the grid includes lithography patterning followed with chemical wet or dry etching of silicon wafers or other substrates. The step of coating the reflective material layer on the grid can include depositing the reflective material by solution method, wet chemical method, vapor deposition or sputtering. The solution method includes spray coating, dipping, electroplating; the wet chemical method includes mixing glucose and silver nitrate solution; the vapor deposition includes physical vapor deposition, chemical vapor deposition and other vapor deposition processes. The reflective material can also be deposited by sputtering of silver, aluminum, platinum and/or other metals.

A third aspect of the present invention provides a display or projector comprising the light out-coupling device of the presently claimed invention.

The light out-coupling device of the presently claimed invention is able to effectively avoid the scattering problem generated from the sapphire substrate and phosphor particles, leading to better image quality. Additionally, due to the presence of the reflective material layer coated on the grid, light adsorption by the array of grid is largely reduced, thereby substantially reducing the loss of output light intensity after the light extra by the light out-coupling device.

BRIEF DESCRIPTION OF THE DRAWINGS

The accompanying drawings illustrate embodiments of the present invention and, together with the description, serve to explain the principles of the invention.

DESCRIPTION OF THE INVENTION

The following examples are used to assist the illustration and understanding of the presently claimed invention, but are not intended to limit the scope of the presently claimed invention.

Figure 1:
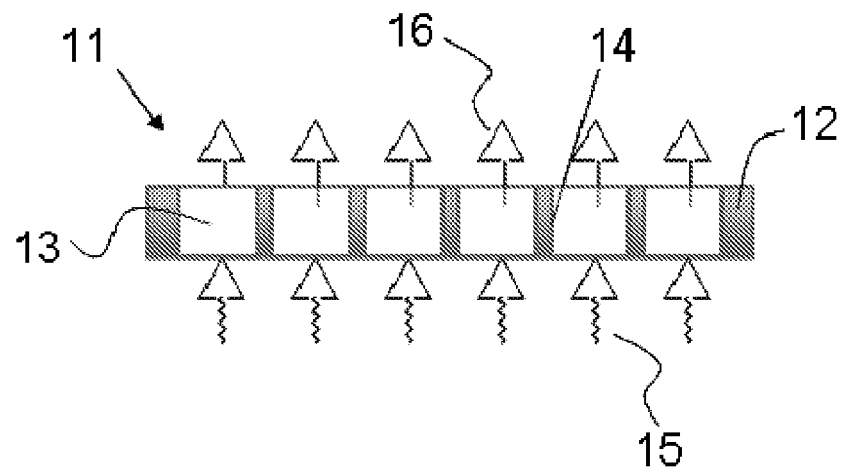
FIG. 1 is a schematic diagram depicting a light out-coupling device according to an embodiment of the presently claimed invention.

FIG. 1 is a schematic diagram depicting a light out-coupling device according to an embodiment of the presently claimed invention. The light out-coupling device 11 is located along a path of the light from a light source to a display panel.

The light out-coupling device 11 comprises a grid 12 having a plurality of channels 13. The grid 12 is coated with a reflective material layer 14. A plurality of light beams 15, came from an array of pointed-light source and comprising an amount of scattered light, passes through the channels 14 of the grid 12. After passing through the grid 12, the light beams 15 are converted into a plurality of aligned light beams 16. Since there is the reflective material layer 14 deposited on the grids, the light beams 15 are substantially reflected by the reflective material layer 13, that avoids the light beams 15 being absorbed by the grid, ultimately reducing the loss of output light intensity, and enhancing the performance of light extraction.

Preferably, the grid is made of silicon, and pitches of the grid are in the range of 50-300 μm. The thickness of the grid can be 100 to 300 μm.

Preferably, the reflective material layer has reflectance more than 97%, The thickness of the reflective material layer is less than 1 μm. The reflective material layer is deposited on the sidewalls of the channels, and made of silver, aluminum or other highly reflective metals. The channels can be square, rectangular, circular or any other regular or irregular shape.

Preferably, the pointed-light source can be, but not limited to LED, LEDoS, polymer light emitting diode (PLED), or organic light emitting diode (OLED).

Figure 2:
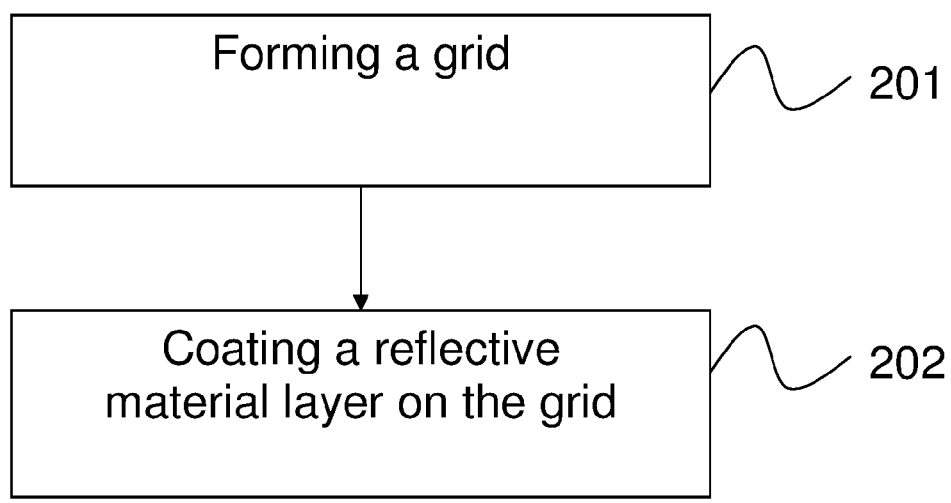
FIG. 2 is a flow chart depicting the steps of a method for fabricating a light out-coupling device according to an embodiment of the presently claimed invention.

FIG. 2 is a flow chart depicting the steps of a method for fabricating a light out-coupling device according to an embodiment of the presently claimed invention. The method comprises the steps of forming a grid (201), and coating a reflective material layer on the grid (202).

Figure 3:
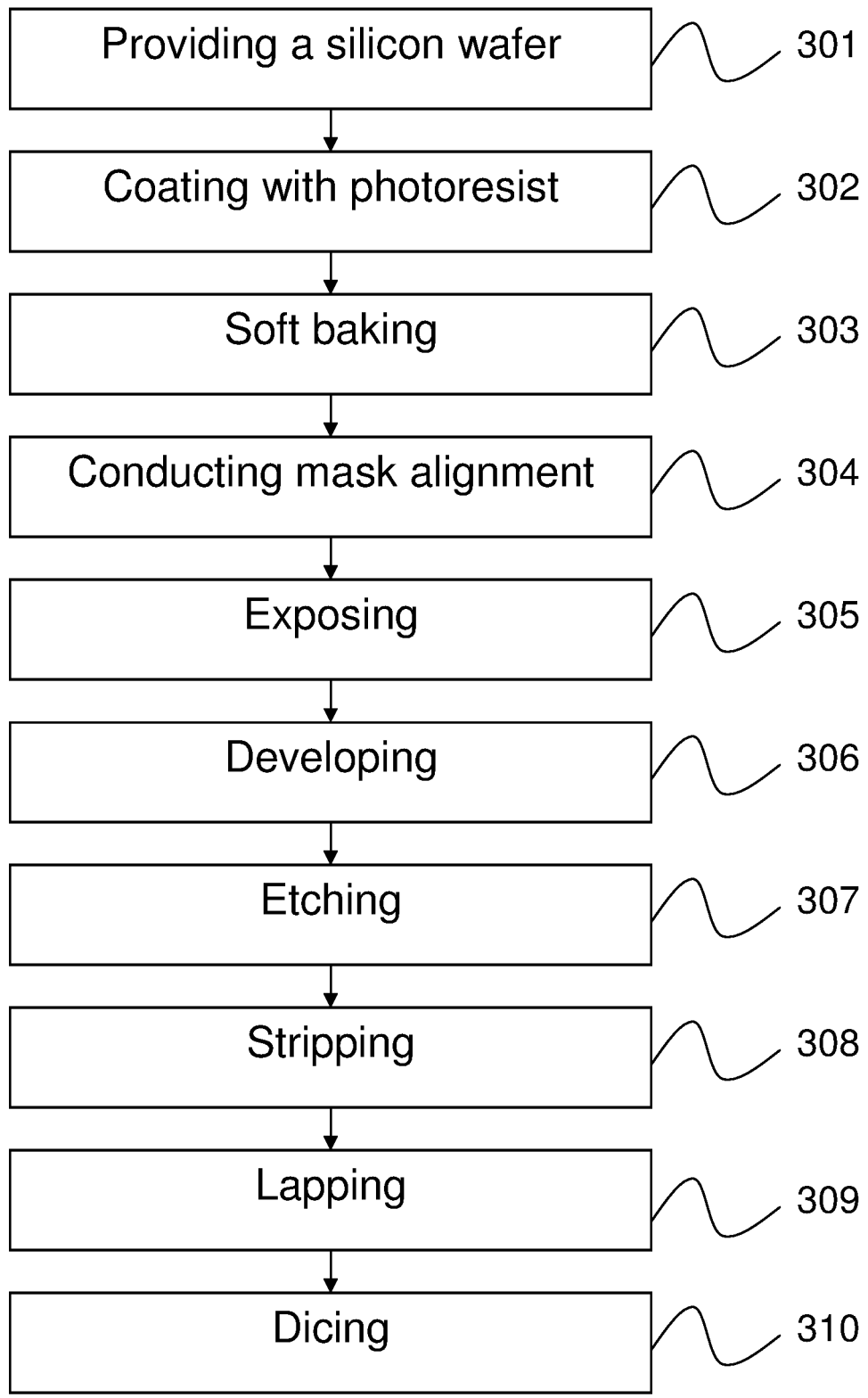
FIG. 3 is a flow chart depicting the steps of forming a grid according to an embodiment of the presently claimed invention.

FIG. 3 is a flow chart depicting the steps of forming a grid according to an embodiment of the presently claimed invention. The method comprises the steps of providing a silicon wafer (301), coating with photoresist (302), soft baking (303), conducting mask alignment (304), exposing (305), developing (306), etching (307), striping (308), lapping (309), and dicing (310).

After formation of the grid, the reflective material layer can be coated on the grid by solution method, wet chemical method, vapor deposition or sputtering. The solution method includes spray coating, dipping, or electroplating; the wet chemical method includes mixing a glucose solution and silver nitrate solution; the vapor deposition includes physical vapor deposition, chemical vapor deposition and other vapor deposition processes. The reflective material can also be deposited on the grid by sputtering of silver, aluminum, platinum and/or other metals.

Figure 4:
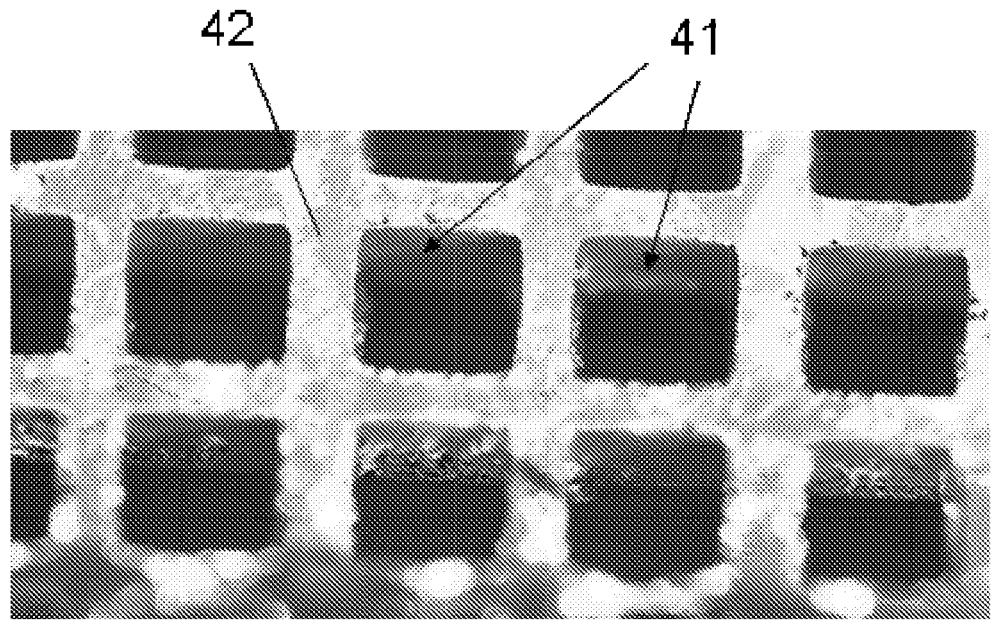
FIG. 4 is a photo showing a light out-coupling device according to an embodiment of the presently claimed invention.

FIG. 4 is a photo showing a light out-coupling device according to an embodiment of the presently claimed invention. The light out-coupling device comprises an array of grid 41 with high reflective surface 42.

Figure 5:
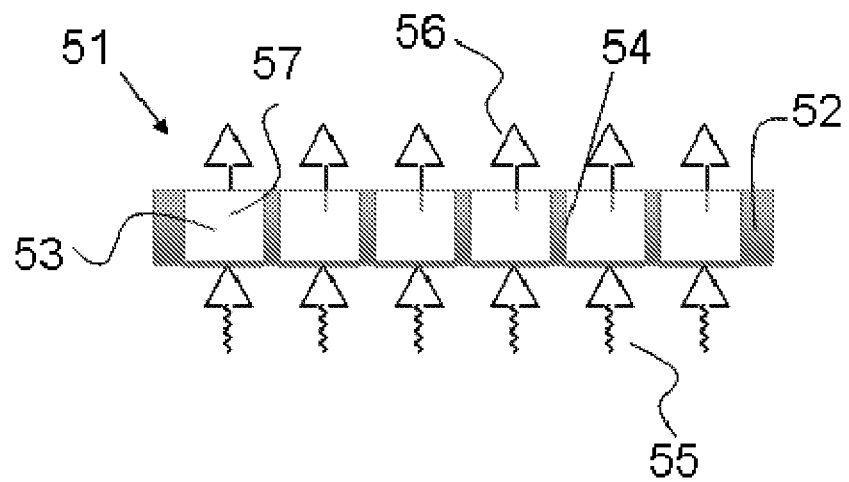
FIG. 5 is a schematic diagram depicting a light out-coupling device according to another embodiment of the presently claimed invention.

FIG. 5 is a schematic diagram depicting a light out-coupling device according to another embodiment of the presently claimed invention. The light out-coupling device 51 comprises a grid 52, having a plurality of channels 53 and coated with a reflective material layer 54, as well as light converting phosphor particles embedded within a polymer to form a polymer composite 57, which is filled into the channels 53 of the grid 52. A plurality of light beams 55, came from an array of pointed-light source and comprising a substantially amount of scattered light, are converted by the light converting phosphor particles into light beams with longer wavelength. After passing through the polymer composite 57 and the channels 53, the light beams 55 are converted into aligned light beams with longer wavelength 56. Since there is the reflective material layer 54 deposited on the sidewalls of the channels 53, the light beams with longer wavelength are substantially reflected by the reflective material layer 54, that avoids the light beams with longer wavelength being absorbed by the grids, ultimately reducing the loss of output light intensity.

Preferably, the polymer includes epoxy or silicon polymer. The polymer composite comprises 10-50 wt % of phosphor content.

Figure 6:
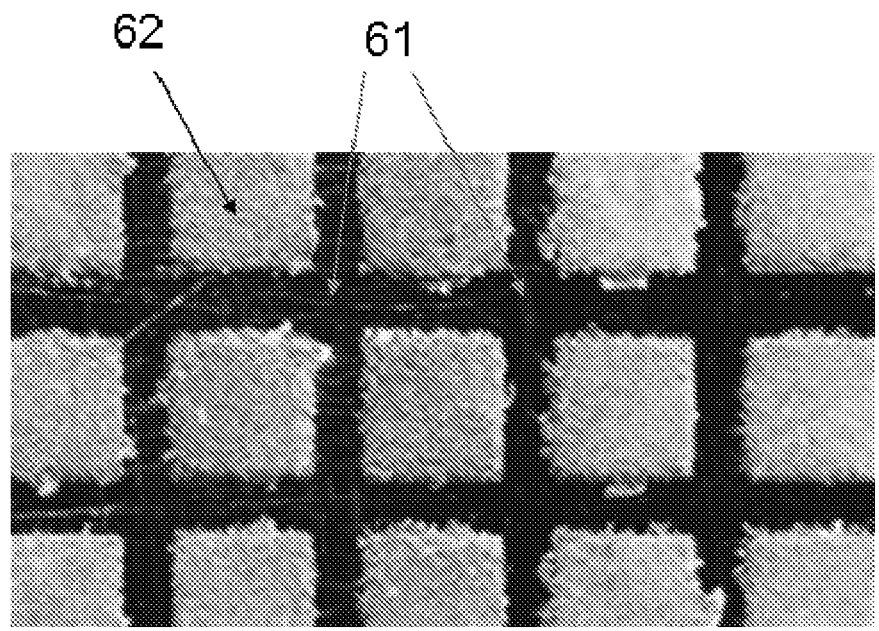
FIG. 6 is a photo showing a light out-coupling device according to another embodiment of the presently claimed invention.

FIG. 6 is a photo showing a light out-coupling device according to another embodiment of the presently claimed invention. The light out-coupling device comprises an array of grid 61, and a polymer composite 62 incorporated with light converting phosphors. The polymer composite 62 is filled into the channels of the grid 61.

Figure 7:
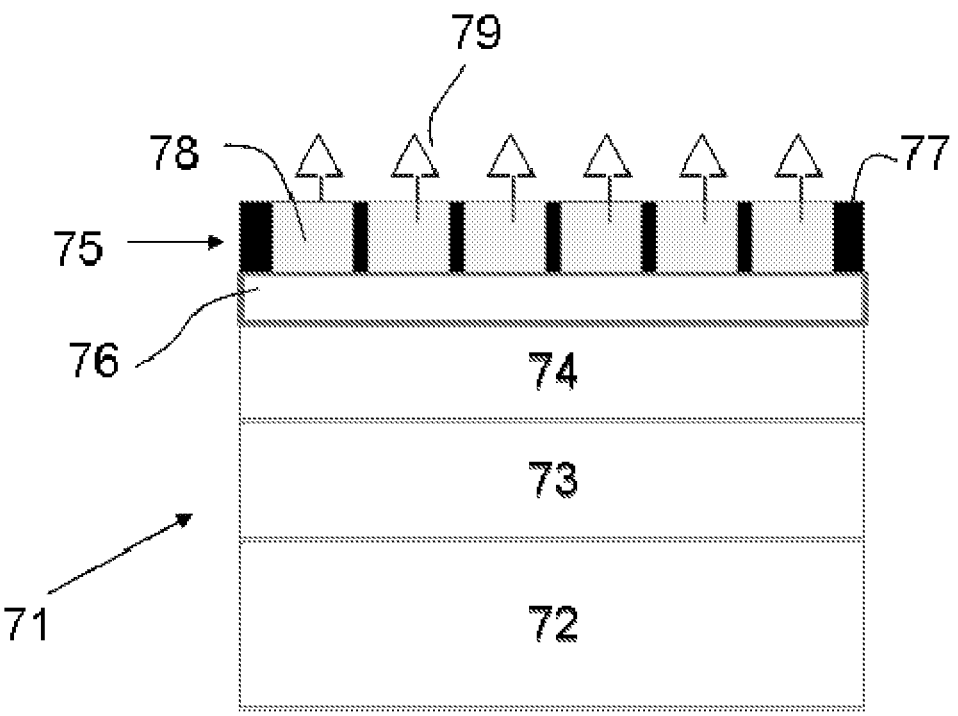
FIG. 7 is a schematic diagram depicting a LED display arrays with a light out-coupling device according to an embodiment of the presently claimed invention.

FIG. 7 is a schematic diagram depicting a LED display with a light out-coupling device according to an embodiment of the presently claimed invention. The LED display 71 comprises a silicon active matrix control 72, LED arrays 73, and a sapphire substrate 74. The light out-coupling device 75 of the present invention, placed on top of the sapphire substrate 74, further comprises a high refractive index fluid layer 76. The high refractive index fluid layer 76 is located between the sapphire substrate 74 and a grid 77, and filled into the gap between the sapphire substrate 74 and the grid 77. The channels of the grid 77 are filled with a polymer composite 78 incorporated light converting phosphor particles. The LED arrays 73 emit light beams, in which some of them are scattered by the sapphire substrate 74. The light beams are further converted by the light converting phosphor particles to provide light beams with longer wavelength. After passing through the grid 77, the light beams emitted from the LED arrays are converted and aligned into aligned light beams with longer wavelength 79. The high refractive index fluid layer 76, being inert and stable, is able to further minimize the scattering effect from the sapphire substrate 74 due to stepwise decrease of refractive index from the sapphire substrate to air.

Preferably, the high refractive index fluid layer comprises, but not limited to silicone oil. The high refractive index fluid layer has a refractive index higher than 1.5.

Figure 8A:
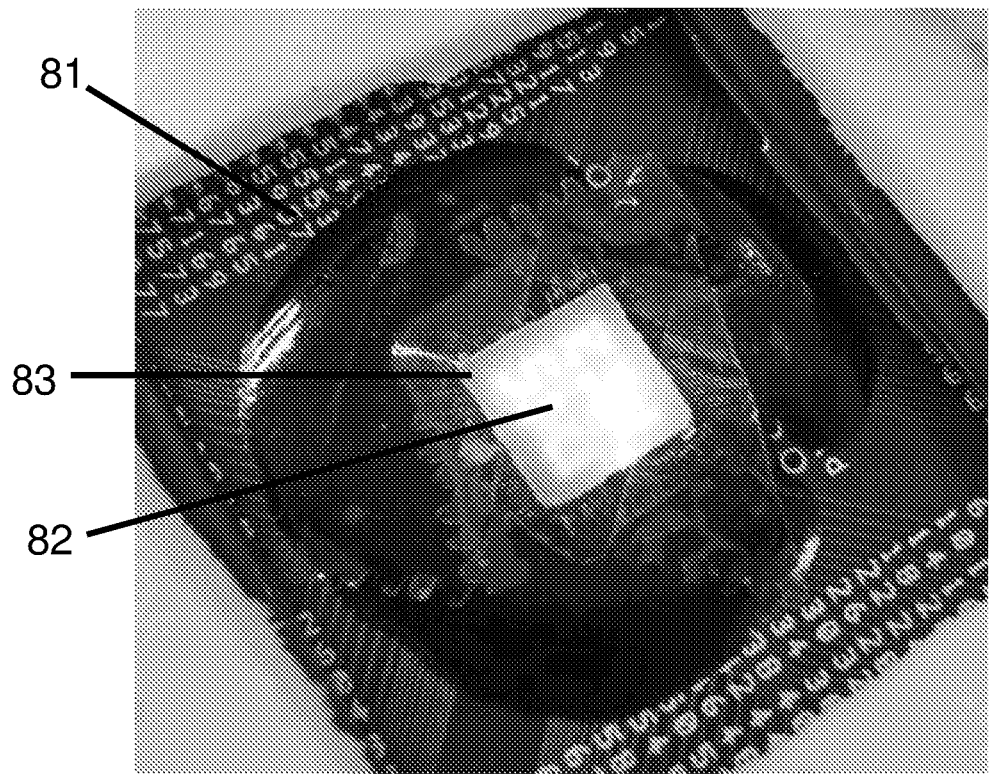
FIG. 8A is a photo showing a LED display filled with red phosphors but without grid installation.
Figure 8B:
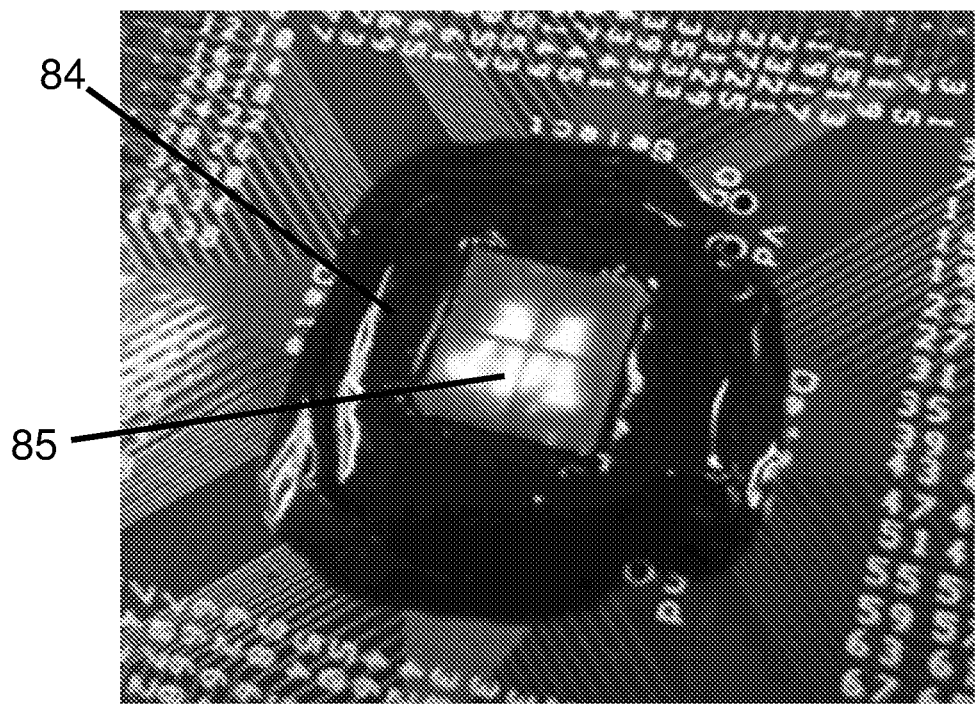
FIG. 8B is a photo showing a LED display with a light out-coupling device filled with red phosphors according to an embodiment of the presently claimed invention.

FIG. 8A is a photo showing a LED display 81 filled with red phosphors but without grid installation. The red phosphors are blended with a polymer 82, which is deposited on top of the LED array 83 of the LED display 81. FIG. 8B is a photo showing a LED display 84 with a light out-coupling device 85 filled with red phosphors according to an embodiment of the presently claimed invention. As shown in both FIG. 8A and FIG. 8B, the image on the screen of FIG. 8B shows much sharper and better quality than that of FIG. 8A, illustrating that the light out-coupling device 85 of the present invention is able to solve the light scattering problem came from the sapphire substrate and the phosphor particles.

Figure 9:
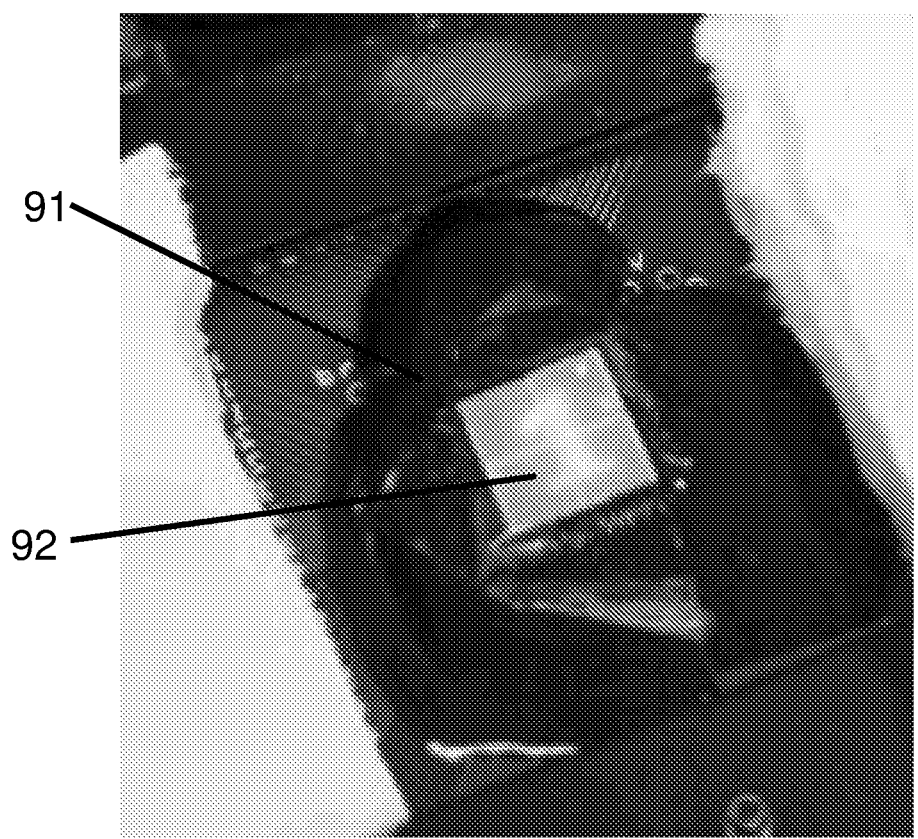
FIG. 9 is a photo showing a LED display with a light out-coupling device filled with green phosphors according to an embodiment of the presently claimed invention.

FIG. 9 is a photo showing a LED display 91 with a light out-coupling device 92 filled with green phosphors according to an embodiment of the presently claimed invention. As shown in the FIG. 9, a sharp and clear image is provided.

According to an embodiment of the present invention, red, green and yellow phosphor particles are filled within their corresponding channels respectively to generate white light.

While embodiments of the present invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A light out-coupling device for light extraction from at least one light source, comprising:
   at least one grid, having one or more channels; and
   at least one reflective material layer coated on at least a portion of the grid,
   wherein the at least one of the one or more channels are configured for allowing light from the light source to pass through; and
   wherein the grid comprises silicon.

2. The device of claim 1, wherein the device is located along a path of light from the light source to a display panel.

3. The device of claim 1, wherein one or more pitches of the grid are in a range of 50 to 300 μm.

4. The device of claim 1, wherein the grid is formed by lithography patterning followed by chemical wet etching or dry etching of a substrate.

5. The device of claim 1, wherein the reflective material layer comprises silver, aluminum, or platinum.

6. The device of claim 1, wherein the reflective material layer is coated on sidewalls of the channels.

7. The device of claim 1, wherein the reflective material layer is coated on the grids by a solution method, a wet chemical method, vapor deposition, or sputtering.

8. The device of claim 7, wherein the solution method comprises spray coating, dipping, or electroplating.

9. The device of claim 7, wherein the wet chemical method comprises mixing of a glucose solution and a silver nitrate solution.

10. The device of claim 1, further comprising at least one high refractive index fluid layer, wherein the high refractive index fluid layer is located between the grid and the light source.

11. The device of claim 10, wherein the high refractive index fluid layer comprises silicone oil.

12. The device of claim 1, further comprising light converting phosphor particles, wherein the light converting phosphor particles are filled into the channels of the grid.

13. The device of claim 12, wherein the light converting phosphor particles are embedded in a polymer composite.

14. The device of claim 13, wherein the polymer composite comprises 10-50 wt % of the light converting phosphor particles.

15. The device of claim 1, wherein the light source is an array of pointed-light sources.

16. The device of claim 1, wherein the light source includes light emitting diode, light emitting diode on silicon, polymer light emitting diode, or organic light emitting diode.

17. A display or projector, comprising the device of claim 1.

18. A light out-coupling device for light extraction from at east one light source, comprising:
   at least one grid, having one or more channels; and
   at least one reflective material layer coated on at least a portion of the grid;
   wherein the at least one of the one or more channels are configured for allowing light from the light source to pass through; and
   wherein the grid is formed by lithography patterning followed by chemical wet etching or dry etching of a substrate.

19. A light out-coupling device for light extraction from at least one light source, comprising:
   at least one grid, having one or more channels; and
   at least one reflective material layer coated on at least a portion of the grid;
   wherein the at least one of the one or more channels are configured for allowing light from the light source to pass through;
   wherein the reflective material layer is coated on the grids by a wet chemical method, and the wet chemical method comprises mixing of a glucose solution and a silver nitrate solution.

20. A light out-coupling device for light extraction from at least one light source, comprising:
   at least one grid, having one or more channels;
   at least one reflective material layer coated on at least a portion of the grid; and
   at least one high refractive index fluid layer, wherein the high refractive index fluid layer is located between the grid and the light source;
   wherein the at least one of the one or more channels are configured for allowing light from the light source to pass through.

21. A light out-coupling device for light extraction from at least one light source, comprising:
   at least one grid, having one or more channels;
   at least one reflective material layer coated on at least a portion of the grid; and
   light converting phosphor particles, wherein the light converting phosphor particles are filled into the channels of the grid;
   wherein the at least one of the one or more channels are configured for allowing light from the light source to pass through.

22. A light out-coupling device for light extraction from at east one light source, comprising:
   at least one grid, having one or more channels; and
   at least one reflective material layer coated on at least a portion of the grid,
   wherein the at least one of the one or more channels are configured for allowing light from the light source to pass through; and
   wherein the light source is an array of pointed-light sources.

* * * * *